United States Patent [19]

Ngo et al.

[11] Patent Number: 5,757,566
[45] Date of Patent: May 26, 1998

[54] DIRECT AC-COUPLED AMPLIFIER WITH IMPROVED COMMON MODE REJECTION FOR MR HEADS

[75] Inventors: Tuan V. Ngo, Eden Prairie; Craig M. Brannon, St. Louis Park, both of Minn.

[73] Assignee: VTC Inc., Bloomington, Minn.

[21] Appl. No.: 707,959

[22] Filed: Sep. 10, 1996

[51] Int. Cl.$^6$ .................. G11B 5/09; G11B 5/03; G11B 5/02
[52] U.S. Cl. .................. 360/67; 360/46; 360/66
[58] Field of Search .................. 360/46, 66, 67, 360/68

[56] References Cited

U.S. PATENT DOCUMENTS

| | | | |
|---|---|---|---|
| 4,833,559 | 5/1989 | Belk | 360/113 |
| 5,309,294 | 5/1994 | Cahalan | 360/66 |
| 5,412,518 | 5/1995 | Christner et al. | 360/66 |
| 5,426,542 | 6/1995 | Smith | 360/67 |
| 5,434,717 | 7/1995 | Yoshinaga et al. | 360/68 |
| 5,452,148 | 9/1995 | Kawai et al. | 360/67 |
| 5,548,453 | 8/1996 | Sasaki et al. | 360/67 |
| 5,598,128 | 1/1997 | Veit et al. | 330/352 |
| 5,623,378 | 4/1997 | Shibasaki et al. | 360/67 |

Primary Examiner—Aristotelis M. Psitos
Assistant Examiner—Regina Y. Neal
Attorney, Agent, or Firm—Kinney & Lange, P.A.

[57] ABSTRACT

A direct AC-coupled amplifier for use with a plurality of magnetoresistive read elements includes a differential amplifier having first and second inputs and first and second outputs. A plurality of input circuits are provided, one for each MR element. Each input circuit has first and second connections to opposite sides of the respective MR element and a pair of emitter-follower its. Each emitter-follower circuit comprises a transistor having a base connected to one of the connections and a collector arranged to be connected a first voltage source. A capacitor is connected between the emitter of each of the transistors and a respective input of the amplifier. A current is applied to the first and second connections of a selected one of the input circuits to operate the respective MR element.

18 Claims, 1 Drawing Sheet

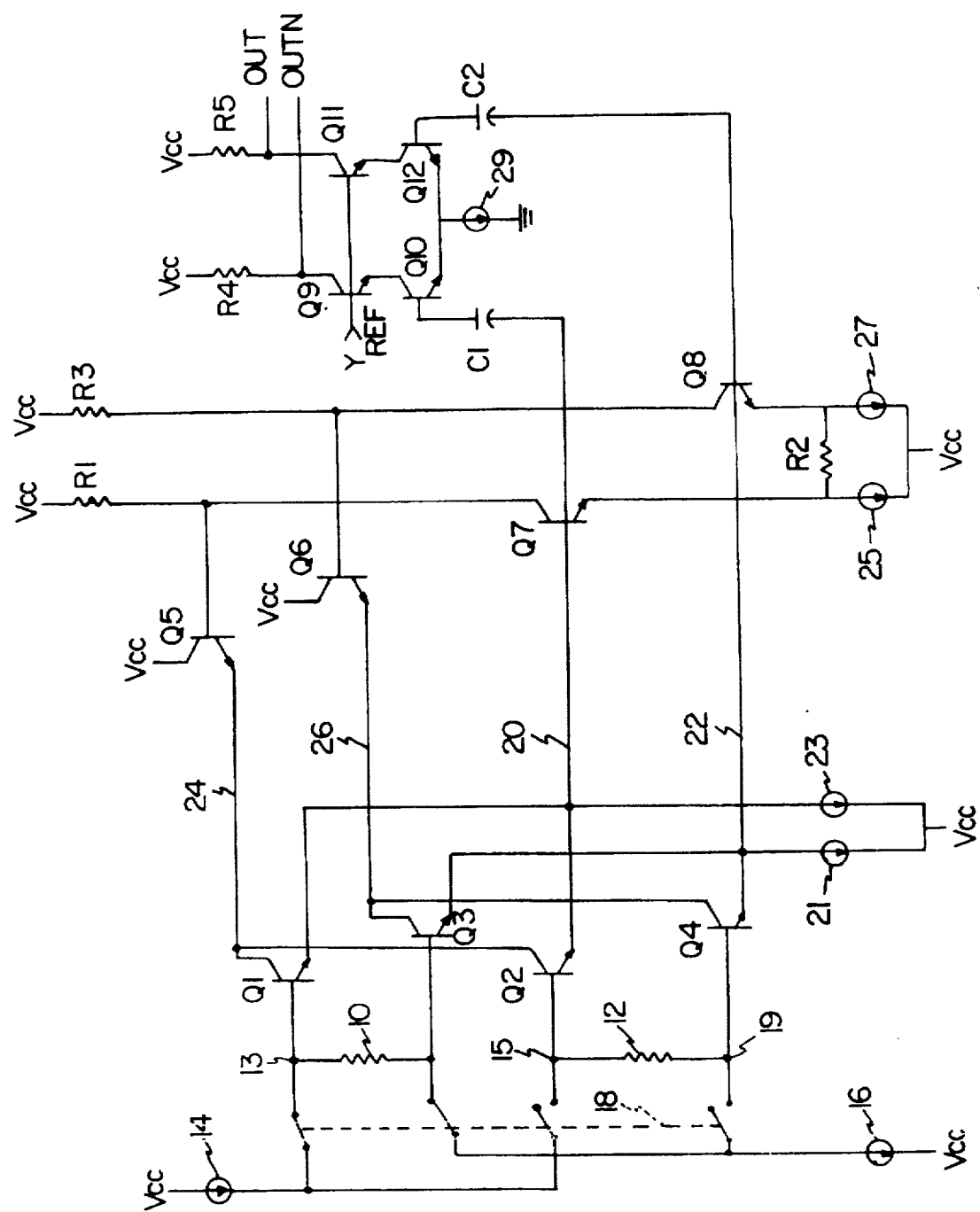

5,757,566

DIRECT AC-COUPLED AMPLIFIER WITH IMPROVED COMMON MODE REJECTION FOR MR HEADS

BACKGROUND OF THE INVENTION

This invention relates a direct AC-coupled amplifier for use with a plurality of magnetoresistive (MR) read heads. More particularly, this invention is directed to a direct AC-coupled amplifier with improved common mode rejection.

In magnetic disc storage systems, it is common to employ MR elements to transduce data recorded on the disc surface to electrical signals for amplification and processing by the data processing apparatus. The MR element is mounted to an actuator arm to be selectively positioned adjacent various concentric tracks on the disc surface. Usually, a separate MR element is employed for each disc recording surface so that where both sides of a disc are recording surfaces, two MR elements are employed. It is also common to stack plural discs for common rotation about a single spindle axis. Thus, a stack of six discs might employ as many as twelve recording surfaces and twelve MR elements.

Ordinarily, data are read from a single disc surface at any given time. Consequently, it is desirable that the bias current to the MR elements be selectively applied only to that element currently active. Data on the recording surface are transduced by the MR element which changes its impedance in accordance with changes in magnetic flux from data recorded on the surface. This change in impedance alters the voltage across the MR element caused by the bias current, the changing voltage then is applied to an amplifier for processing.

It will be appreciated that the signal applied to the amplifier is an alternating current (AC) signal. However, due to nonlinearity in the response of the MR element, the signal also contains a direct current (DC) offset which adversely affects the recovery of data. For this reason, it is common to employ capacitors to block the DC signal from the MR element so that only the AC signal is applied to the amplifier. Ordinarily, these DC blocking capacitors are quite large, and in the past have been incorporated as discrete elements separated from the chip that processes the read signals. Ordinarily, a separate set of DC-blocking capacitors is employed for each of the read channels. Often, a separate read amplifier employed for each read channel.

The present invention is directed to an AC-coupled amplifier for coupling to a selected one of a plurality of MR elements.

SUMMARY OF THE INVENTION

The present invention is directed to a direct AC-coupled amplifier for use with a plurality of magnetoresistive read elements. The amplifier includes a differential amplifier having first and second inputs and first and second outputs. A plurality of input circuits is provided, one for each MR element. Each input circuit has means for connecting to opposite sides of the respective MR element and a pair of emitter-follower circuits. Each emitter-follower circuit comprises a transistor having a base connected to one of the connection means, a collector arranged to be connected a first voltage source and an emitter. A capacitor is connected between the emitter of each of the transistors and a respective input of the amplifier. Means is provided to apply a bias current to the first and second connection means of a selected one of the input circuits to operate the respective MR element.

In a preferred form of the invention, a common mode rejection compensation circuit is connected to the emitter-follower transistors of the input circuits. The common mode rejection compensation circuit includes transistors operating as a differential amplifier with a unity gain to supply a voltage source to the emitter-follower transistors so that the collector-emitter voltages of the emitter-follower transistors are equal. More particularly, the common mode rejection compensation circuit includes a first and second pairs of transistors. The transistors of the first pair have their collectors connected to the voltage source and their emitters connected to the collectors of respective ones of the emitter-follower transistors of each input pair. The transistors of the second pair have their bases connected to emitters of respective ones of the emitter-follower transistors of each input pair, their collectors connected to the base of a respective transistor of the first pair, and an emitter connected to a second voltage source. An impedance is connected between the emitters of the transistors of the second pair.

In a preferred form of the invention, the differential amplifier is a cascoded differential amplifier that comprises a first pair of transistors each having a base connected to a reference voltage, a collector connected to a respective output of the amplifier. A second pair of transistors have collectors connected to an emitter of a respective transistor of the first pair and a base that forms a respective first or second input of the amplifier. The emitters of the second pair of transistors are connected together.

BRIEF DESCRIPTION OF THE DRAWINGS

The sole FIGURE is a circuit diagram of the direct AC-coupled amplifier according to the presently preferred embodiment of the present invention.

DETAILED DESCRIPTION OF THE PREFERRED EMBODIMENTS

As shown in the drawing two MR elements 10, 12 are each arranged to be connected on one side by a terminal 13, 15 to current source 14 of bias current and voltage supply Vcc and on the other side by a terminal 17, 19 to a current drain 16 and voltage source Vcc. A switch 18 is diagrammatically illustrated in the drawing to selectively connect one or another of MR elements 10 and 12 between source 14 and drain 16. Although shown as a mechanical switch, it is understood that switch 18 is actually a plurality of electronically operated semiconductor switches. Also, although only two MR elements 10 and 12 are shown in the drawings, any number of elements may be employed, each arranged to be connected through the semiconductor switch 18 to source 14 and drain 16. Terminal 13, 15 on one side of each MR element 10, 12 is connected to the base of an emitter-follower transistor Q1, Q2, and the other terminal 17, 19 on the opposite side of each MR element is connected to the base of an emitter-follower transistor Q3, Q4. The collectors of each of transistors Q1–Q4 are connected to source Vcc through a common-mode rejection compensation circuit. Likewise, the emitters of transistors Q1–Q4 are connected through respective current drains 21, 23 to voltage source Vee. The emitters of transistors Q1 and Q2 are connected together, and via bus 20 through AC coupling capacitor C1 to the base of transistor Q10 of a differential amplifier. The emitters of transistors Q3 and Q4 are connected together, and via bus 22 through AC coupling capacitor C2 to the base of transistor Q12 of the differential amplifier.

Common mode rejection is provided by the circuit comprising transistors Q5, Q6, Q7, and Q8, and resistors R1, R2 and R3 and current drains 25 and 27. The collectors of transistor Q5 and Q6 are connected to source Vcc. The emitters of transistors Q5 and Q6 are connected through respective channels 24 and 26 to supply the Vcc source to the collectors of transistors Q1–Q4. The bases of transistors Q7 and Q8 are connected to respective channels 20 and 22 and the emitters of respective emitter-follower transistors Q1–Q4. The emitters of transistors Q7 and Q8 are connected together through resistor R2, and through respective current drains 25, 27 to source Vcc. Source Vcc is connected through resistor R1 to the base of transistor Q5 and through resistor R3 to the base of transistor Q6. The collectors of transistors Q7 and Q8 are connected to the bases of transistors Q5 and Q6, respectively.

Transistors Q9–Q12, together with resistors R4 and R5, form a cascoded differential amplifier for output at OUT and OUTN. The cascoded differential amplifier comprises transistors Q10 and Q12 having their emitters coupled together and through current drain 29 to ground, and their collectors connected to respective emitters of transistors Q9 and Q11. A reference voltage source is applied to the bases of transistors Q9 and Q11 and the collectors of transistors Q9 and Q11 are connected to outputs OUTN and OUT respectively, and through resistors R4 and R5 to source Vcc.

In operation, the emitter-follower circuits Q1 and Q3 buffer the AC voltage signal across MR element 10 to channels 20 and 22. Channels 20 and 22 are AC coupled through capacitors C1 and C2 to the differential amplifier comprising transistors Q9–Q12. Capacitors C1 and C2 block DC components in the signal, thereby eliminating DC offset across the MR element. The common mode rejection compensation circuit comprising transistors Q5–Q8 is differentially connected to channels 20 and 22 and has a unity gain to maintain the collector-emitter voltage of the active one of transistors Q1 and Q2 equal to the collector-emitter voltage of the active one of transistors Q3 and Q4. This improves the common rejection ratio of the amplifier.

The emitter-follower configuration of transistors Q1–Q4 permits only the head selected by switch 18 to make active the transistor pair Q1,Q3 or Q2,Q4, to thereby determine the voltage applied to bus 20, 22. Hence, the non-selected head(s) do not affect performance of the circuit. Moreover, the emitter-follower configuration provides a low impedance to drive the amplifier formed by transistors Q9–Q12.

Only a single pair of capacitors C1 and C2 are employed for AC coupling and DC blocking to the amplifier. Since these capacitors are fairly large, by employing only two for the multitude of heads, it is practical to place capacitors C1 and C2 directly on the chip used for the selection and amplification process. As a result, AC coupling and DC blocking can occur on the same chip as head selection, thereby improving performance of the circuit.

Although the present invention has been described with reference to preferred embodiments, workers skilled in the art will recognize that changes may be made in form and detail without departing from the spirit and scope of the invention.

What is claimed is:

1. An amplifier for providing a signal from a selected one of a plurality of magnetoresistive read elements comprising, in combination:

a first differential amplifier having first and second inputs and first and second outputs;

a plurality of input circuits each having first and second connection means for connecting opposite sides of a magnetoresistive element, and a pair of emitter-follower circuits comprising a first transistor having a base connected to the first connection means, a collector arranged to be connected a first voltage source and an emitter, and a second transistor having a base connected to the second connection means, a collector arranged to be connected to the first voltage source and an emitter;

a first capacitor connected between the emitter of each of the first transistors and the first input of the amplifier;

a second capacitor connected between the emitter of each of the second transistors and the second input of the amplifier, the first and second capacitors providing AC coupling and DC blocking between the emitters of each first and second transistor and the amplifier;

a source of bias current; and means for applying the bias current to the first and second connection means of a selected one of the input circuits.

2. Apparatus as in claim 1, including a common mode rejection compensation circuit connected to all of the first and second transistors.

3. Apparatus as in claim 2, wherein the common mode rejection compensation circuit includes a third transistor having an emitter connected to the collectors of the first transistors, a collector connected to a first voltage source, and a base connected through a first impedance to the first voltage source, a fourth transistor having an emitter connected to the collectors of the second transistors, a collector connected to the first voltage source, and a base connected through a second impedance to the first voltage source, a fifth transistor having a base connected to the emitters of the first transistors, a collector connected to the base of the third transistor and an emitter connected to a second voltage source, a sixth transistor having a base connected to the emitters of the second transistors, a collector connected to the base of the fourth transistor and an emitter connected to the second voltage source, and a third impedance connected between the bases of the fifth and sixth transistors, the third and fourth transistors providing a unity gain to maintain the collector-emitter voltages of the first and second transistors equal.

4. Apparatus as in claim 3, wherein the first differential amplifier comprises seventh and eighth transistors each having a base arranged to be connected to a source of reference voltage, a collector connected through an impedance to the first voltage source, and an emitter, the first output being connected to the collector of the seventh transistor and the second output being connected to the collector of the eighth transistor, and ninth and tenth transistors each having a collector connected to the emitter of a respective seventh and eighth transistor, a base and an emitter, the emitters of the ninth and tenth transistors being connected together and to a current drain, the base of the ninth transistor forming the first amplifier input and the base of the tenth transistor forming the second amplifier input.

5. Apparatus as in claim 4, wherein the first differential amplifier, the plurality of input circuits, the first and second capacitors and the common mode rejection compensation circuit are embodied on a single chip.

6. Apparatus as in claim 2, wherein the common mode rejection compensation circuit includes a second differential amplifier connected to the collectors of the first and second transistors, the second differential amplifier having a gain of unity to maintain the collector-emitter voltages of the first and second transistors equal.

7. Apparatus as in claim 6, wherein the first differential amplifier comprises seventh and eighth transistors each having a base arranged to be connected to a source of reference voltage, a collector connected through an impedance to the first voltage source, and an emitter, the first output being connected to the collector of the seventh transistor and the second output being connected to the collector of the eighth transistor, and ninth and tenth transistors each having a collector connected to the emitter of a respective seventh and eighth transistor, a base and an emitter, the emitters of the ninth and tenth transistors being connected together and to a current drain, the base of the ninth transistor forming the first amplifier input and the base of the tenth transistor forming the second amplifier input.

8. Apparatus as in claim 1, including a first bus connected between the emitters of all of the first transistors and the first capacitor and a second bus connected between the emitters of all of the second transistors and the second capacitor.

9. Apparatus as in claim 8, including a common mode rejection compensation circuit connected to all of the first and second transistors.

10. Apparatus as in claim 9, wherein the common mode rejection compensation circuit includes a third transistor having an emitter connected to the collectors of the first transistors, a collector connected to a first voltage source, and a base connected through a first impedance to the first voltage source, a fourth transistor having an emitter connected to the collectors of the second transistors, a collector connected to the first voltage source, and a base connected through a second impedance to the first voltage source, a fifth transistor having a base connected to the emitters of the first transistors, a collector connected to the base of the third transistor and an emitter connected to a second voltage source, a sixth transistor having a base connected to the emitters of the second transistors, a collector connected to the base of the fourth transistor and an emitter connected to the second voltage source, and a third impedance connected between the bases of the fifth and sixth transistors, the third and fourth transistors providing a unity gain to maintain the collector-emitter voltages of the first and second transistors equal.

11. Apparatus as in claim 10, wherein first the differential amplifier comprises seventh and eighth transistors each having a base arranged to be connected to a source of reference voltage, a collector connected through an impedance to the first voltage source, and an emitter, the first output being connected to the collector of the seventh transistor and the second output being connected to the collector of the eighth transistor, and ninth and tenth transistors each having a collector connected to the emitter of a respective seventh and eighth transistor, a base and an emitter, the emitters of the ninth and tenth transistors being connected together and to a current drain, the base of the ninth transistor forming the first amplifier input and the base of the tenth transistor forming the second amplifier input.

12. Apparatus as in claim 11, wherein the first differential amplifier, the plurality of input circuits, the first and second capacitors and the common mode rejection compensation circuit are embodied on a single chip.

13. Apparatus as in claim 9, wherein the common mode rejection compensation circuit includes a second differential amplifier connected to the collectors of the first and second transistors, the second differential amplifier having a gain of unity to maintain the collector-emitter voltages of the first and second transistors equal.

14. Apparatus as in claim 13, wherein the first differential amplifier comprises seventh and eighth transistors each having a base arranged to be connected to a source of reference voltage, a collector connected through an impedance to the first voltage source, and an emitter, the first output being connected to the collector of the seventh transistor and the second output being connected to the collector of the eighth transistor, and ninth and tenth transistors each having a collector connected to the emitter of a respective seventh and eighth transistor, a base and an emitter, the emitters of the ninth and tenth transistors being connected together and to a current drain, the base of the ninth transistor forming the first amplifier input and the base of the tenth transistor forming the second amplifier input.

15. Apparatus as in claim 14, wherein the first differential amplifier, the plurality of input circuits, the first and second capacitors and the common mode rejection compensation circuit are embodied on a single chip.

16. Apparatus as in claim 1, wherein the first differential amplifier comprises seventh and eighth transistors each having a base arranged to be connected to a source of reference voltage, a collector connected through an impedance to the first voltage source, and an emitter, the first output being connected to the collector of the seventh transistor and the second output being connected to the collector of the eighth transistor, and ninth and tenth transistors each having a collector connected to the emitter of a respective seventh and eighth transistor, a base and an emitter, the emitters of the ninth and tenth transistors being connected together and to a current drain, the base of the ninth transistor forming the first amplifier input and the base of the tenth transistor forming the second amplifier input.

17. Apparatus as in claim 1, wherein the first differential amplifier comprises third and fourth transistors each having a collector, a base and an emitter, the emitters of the third and fourth transistors being connected together and to a current drain, the base of the third transistor forming the first amplifier input and the base of the fourth transistor forming the second amplifier input.

18. An amplifier for providing a signal from a selected one of a plurality of magnetoresistive read elements comprising, in combination:

a plurality of input circuits each having first and second terminals for connecting to opposite sides of a magnetoresistive element, first emitter-follower circuit comprising a first transistor having a base connected to the first terminal, a collector arranged to be connected a first voltage source and an emitter, and a first emitter-follower circuit comprising a second transistor having a base connected to the second terminal, a collector arranged to be connected to the first voltage source and an emitter;

means for applying a bias current to the first and second terminals of a selected one of the input circuits;

a first capacitor having a first side connected to the emitter of each of the first transistors;

a second capacitor having a first side connected to the emitter of each of the second transistors; and third and fourth transistors forming a differential amplifier, the third and fourth transistors each having a collector, a base and an emitter, the emitters of the third and fourth transistors being connected together and to a current drain, the collectors of the first and second transistors being coupled to respective first and second outputs of the amplifier, a second side of the first capacitor being coupled to the base of the third transistor and a second side of the second capacitor being coupled to the base of the fourth transistor so that the first and second capacitors providing AC coupling and DC blocking between the input circuits and the differential amplifier.

* * * * *

UNITED STATES PATENT AND TRADEMARK OFFICE
CERTIFICATE OF CORRECTION

PATENT NO. : 5,757,566
DATED : MAY 26, 1998
INVENTOR(S) : TUAN V. NGO, CRAIG M. BRANNON

It is certified that error appears in the above-indentified patent and that said Letters Patent is hereby corrected as shown below:

Item [57] ABSTRACT, line 7, delete "its", insert --circuits--

Item [57] ABSTRACT, line 12, after A, insert --bias--

Col. 2, line 42, delete "Vcc", insert --Vee--

Col. 3, line 10, delete "Vcc" (first occurrence), insert --Vee--

Signed and Sealed this

First Day of September, 1998

*Attest:*

BRUCE LEHMAN

*Attesting Officer*  Commissioner of Patents and Trademarks

UNITED STATES PATENT AND TRADEMARK OFFICE
CERTIFICATE OF CORRECTION

PATENT NO. : 5,757,566
DATED : May 26, 1998
INVENTOR(S) : TUAN V. NGO, CRAIG M. BRANNON

It is certified that error appears in the above-indentified patent and that said Letters Patent is hereby corrected as shown below:

For [57] ABSTRACT, line 7, delete "its', insert --circuits--

For [57] ABSTRACT, line 12, after A, insert --bias--

In Col. 2, line 42, delete "Vcc", insert --Vee--

In Col. 3, line 10, delete "Vcc" (first occurrence), insert --Vee--

In Col. 6, line 60, before "first" insert --a--

In Col. 6, line 64, delete "first", insert --second--

Signed and Sealed this

First Day of December, 1998

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,757,566
DATED : May 26, 1998
INVENTOR(S) : Tuan V Ngo et al.

It is certified that error appears in the above-identified patent and that said Letters Patent is hereby corrected as shown below:

Column 8,
Line 1, delete "first and second", insert -- third and first --

Signed and Sealed this

Fourteenth Day of May, 2002

*Attest:*

JAMES E. ROGAN
*Attesting Officer*         *Director of the United States Patent and Trademark Office*